US007035887B2

(12) United States Patent
Ziegler et al.

(10) Patent No.: US 7,035,887 B2
(45) Date of Patent: Apr. 25, 2006

(54) APPARATUS AND METHOD FOR DATA SHIFTING

(75) Inventors: James Craig Ziegler, Plympton, MA (US); Roy Miles, Morgan Hill, CA (US); Brent Schusheim, Wenham, MA (US)

(73) Assignee: LTX Corporation, Westwood, MA (US)

( * ) Notice: Subject to any disclaimer, the term of this patent is extended or adjusted under 35 U.S.C. 154(b) by 595 days.

(21) Appl. No.: 10/197,119

(22) Filed: Jul. 17, 2002

(65) Prior Publication Data

US 2004/0015526 A1    Jan. 22, 2004

(51) Int. Cl.
*G06F 15/00* (2006.01)
(52) U.S. Cl. .................................... 708/209
(58) Field of Classification Search ............ 708/209, 708/200; 712/221
See application file for complete search history.

(56) References Cited

U.S. PATENT DOCUMENTS

| | | | | |
|---|---|---|---|---|
| 5,020,013 A | * | 5/1991 | Maher et al. | 708/209 |
| 5,337,269 A | * | 8/1994 | McMahan et al. | 708/711 |
| 5,844,825 A | * | 12/1998 | Wang et al. | 708/209 |
| 6,304,956 B1 | * | 10/2001 | Tran | 712/221 |

* cited by examiner

*Primary Examiner*—Kakali Chaki
*Assistant Examiner*—Chat C. Do
(74) *Attorney, Agent, or Firm*—Greenberg Traurig, LLP

(57) ABSTRACT

A data shifter selects data from a plurality of data blocks to effectively "window" data contained within the blocks. A second stage of shifting may be implemented by selection among the resultants of the windowing step. Such a shifter may find use in a data aligner.

17 Claims, 7 Drawing Sheets

APPARATUS AND METHOD FOR DATA SHIFTING

RELATED APPLICATIONS

A patent application entitled APPARATUS AND METHOD FOR DATA PATTERN ALIGNMENT, U.S. patent application Ser. No. 10/196,990, having the same inventors as this application, assigned to the same assignee as this application, filed on the same day, i.e., Jul. 17, 2002, as this application, is incorporated herein by reference in its entirety.

FIELD OF THE INVENTION

The present invention relates to the testing of electronics, and more particularly to the shifting of test data patterns.

BACKGROUND OF THE INVENTION

As the operational speed of electronics devices relentlessly increases, the testing of such devices becomes even more problematic. The testing of digital circuitry often involves the transmission of a known data pattern to a device under test (DUT), the creation of a data pattern by the DUT in response, and the comparison of the data pattern created by the DUT to an expected data pattern. A tester may search for a match with a test pattern or a pattern related in a known manner to the test pattern. When we indicate that a tester is searching for a match with a test pattern, the actual search may be for the test pattern or a pattern related in a known manner to the test pattern.

Synchronous serial communications devices operating at high speed are particularly difficult to test. One approach to aligning a test pattern with the output of the communications device (the output of either the device's receive or transmit side) is to set the clocks of the tester and device out of phase relative to one another. In this way, the test pattern will "slide by" the matching pattern the tester employs and the test pattern may thereby be aligned with a matching pattern the tester employs. However, synchronous communications devices often employ clock-tracking circuitry, so that a tester would not be able to communicate with such a device while their clocks are out of phase with one another.

Notwithstanding the performance afforded by conventional digital circuit testers, a digital tester that provides for high-speed alignment of data patterns would be highly desirable.

SUMMARY OF THE INVENTION

A data shifter in accordance with the principles of the present invention accepts a data stream, which may be continuous, and produces a shifted data stream output. The data may be represented in any of a variety of character forms, such as binary or hexadecimal, for example. In an illustrative embodiment, the shifter employs two registers, each the length of a data pattern of interest and a multiplexer configured to select data from the register contents. Data blocks of the length of a pattern of interest from the incoming data stream are sequentially loaded into the first register, then second, registers. Each cycle, the multiplexer selects data from among the register locations. The multiplexer shifts its selections "n" locations to achieve a data shift of "n" locations. In a multistage embodiment, a second shift may be implemented by selecting from among the blocks of output data generated in this first stage of the shifter. For example, every other block from the first stage may "normally" be selected for output, but, in order to implement a whole-block shift, the second stage may select two sequential blocks for output, or skip two sequential blocks (rather than the "normal" one-block skip). A shifter in accordance with the principles of the present invention may be particularly useful in a data aligner.

A data aligner in accordance with the principles of the present invention employs an alignment pattern that is transmitted and shifted as necessary until a receiving device recognizes the alignment pattern. The recognition of the alignment pattern indicates that the receiving and transmitting devices are aligned and the transmission of regular data, for example, a test pattern in a digital test instrument application, may begin.

In a tester that employs such an aligner, the tester may transmit a test pattern to a synchronous serial communications device then monitor the communications device's output for the test pattern (which could be the original pattern or a predictable modification of the test pattern). The aligner ensures that the tester examines the correct portion of data from the communications device. Similarly, a tester that employs such an aligner may receive a pattern generated by a serial communications device under test and compare the received pattern to a test pattern. Again, the aligner may be used to ensure that the tester examines the correct portion of test data emanating from the communications device.

In an illustrative embodiment a tester in accordance with the principles of the present invention includes such an aligner. The tester may be employed to test a synchronous serial communications device that, on its transmission side, accepts parallel data and converts the parallel data to serial form for transmission. Similarly, such a tester may be employed to test a synchronous communications device that, on its receive side, accepts serial data and converts the serial data to parallel form. When such a tester tests the transmit side of such a communications device, the tester generates a test pattern (for example, storing the test pattern in a pattern memory), loads the test pattern in the communications device, and monitors the output of the communications device for a test pattern. In order to be effective, the test pattern will typically be many bytes long. In order to permit the derivation of a clock signal from data transmitted by a synchronous communications device, such devices operate continuously. Consequently, the expected pattern will arrive at a monitoring portion of the tester in a continuous stream of data. Before the tester loads the test pattern in the communications device under test, the aligner loads the device with an alignment pattern that the tester attempts to match on the tester's monitoring side. If no match is detected, the monitoring side of the tester shifts the received pattern, tests for a match, and repeats the shifting/matching process until a match is detected. Once a match is detected, that is, once the alignment pattern is detected on the monitoring side, the pattern generating side is alerted to the fact that alignment has been achieved. The pattern generator side of the tester then proceeds to transmit the actual test pattern, keeping the pattern in alignment with the pattern expected by the monitoring side of the tester.

To test the receive side of such a communications device, the tester transmits a serial test pattern to the serial communications device under test. As in the transmit side test, the test pattern must be aligned with the pattern expected at the monitor side of the tester. In an illustrative embodiment an aligner loads an alignment pattern into a serializer which serializes the alignment pattern. The serialized alignment pattern is transmitted to the communications device being tested. The communications device under test converts the alignment pattern to parallel and the tester attempts to match the pattern on its monitoring side. If no match is detected, the monitoring side of the tester indicates there is no match and the tester's transmission side shifts the alignment pattern. In operation, "no match" may be a default condition that is overridden by the monitoring side of the tester setting a flag whenever the monitoring side detects a match. The tester repeats the shifting/matching process until a match is detected. Once a match is detected, that is, once the alignment pattern is detected on the monitoring side, the pattern generating side is alerted to the fact that alignment has been achieved. The pattern generator side of the tester then proceeds to transmit the actual test pattern, keeping the pattern in alignment with the pattern expected by the monitoring side of the tester.

BRIEF DESCRIPTION OF THE DRAWINGS

The foregoing and other objects of this invention, the various features thereof, as well as the invention itself, may be more fully understood from the following description, when read together with the accompanying drawings as described below.

DETAILED DESCRIPTION

Figure 1:
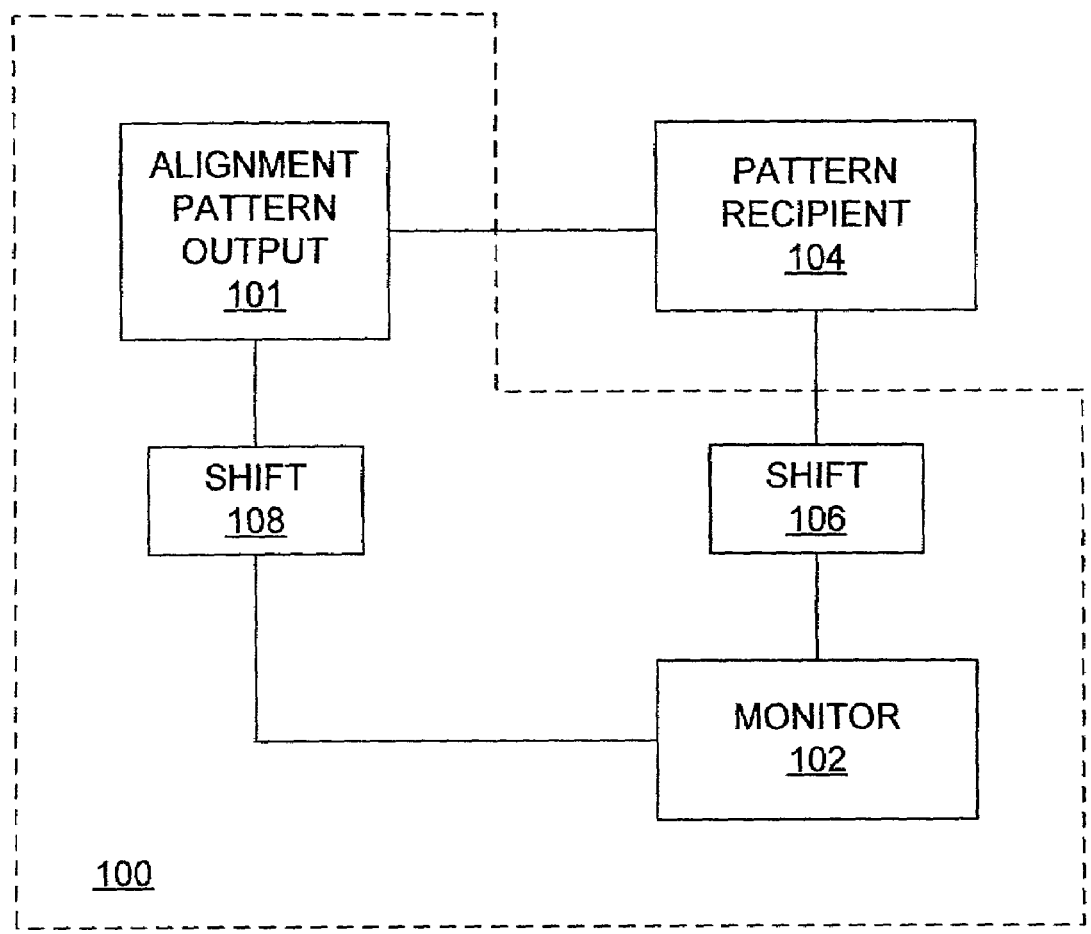
FIG. 1 is a block diagram of a data pattern aligner in accordance with the principles of the present invention.

The conceptual block diagram of FIG. 1 illustrates the major components of a data aligner 100 in accordance with the principles of the present invention. The data aligner 100 employs an alignment pattern that is output 101 and shifted as necessary until a monitoring device 102 recognizes the alignment pattern. The recognition of the alignment pattern indicates that a pattern recipient 104 is aligned with the data aligner and that the transmission of regular data may commence. In a digital test equipment application, the regular data may be a test pattern, and the pattern recipient 104 may be a device under test, for example. As illustrated in the conceptual block diagram of FIG. 1, a shifter 106 may be operative between the pattern recipient and the monitor and/or a shifter 108 may be operative in the data path between the monitor and the alignment pattern output 101 to provide the shifting necessary for alignment.

In a tester that employs such an aligner, the tester may transmit a test pattern to a synchronous serial communications device then monitor the communications device's output for the test pattern (which could be the original pattern or a predictable modification of the test pattern). The aligner ensures that the tester examines the correct portion of data from the communications device. Similarly, a tester that employs such an aligner may receive a pattern generated by a serial communications device under test and compare the received pattern to a test pattern. The aligner may be used to ensure that the tester examines the correct portion of test data emanating from the communications device.

Figure 2:
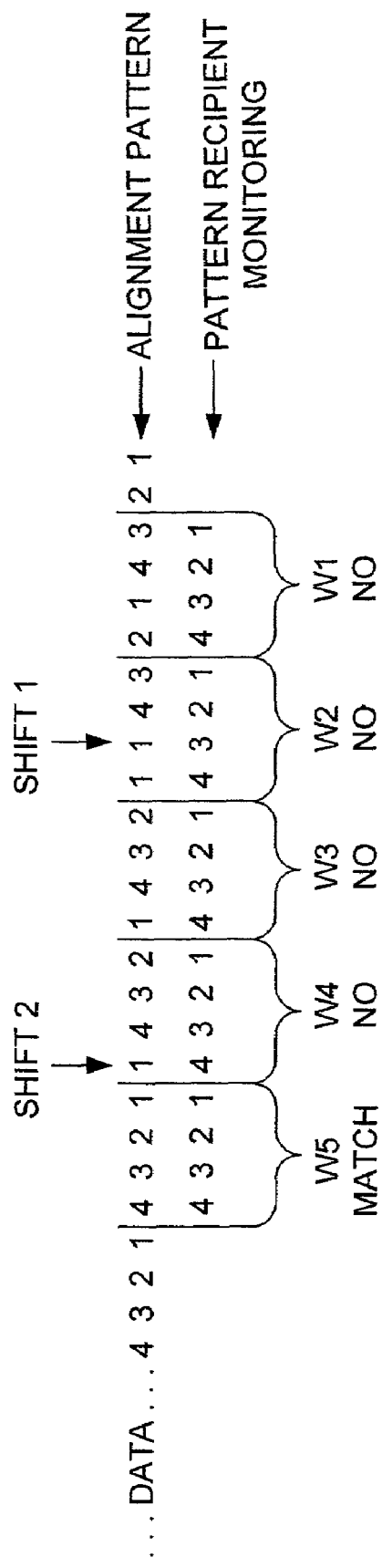
FIG. 2 is a conceptual diagram of a shifting alignment in accordance with the principles of the present invention.

The conceptual signal diagram of FIG. 2 provides a detailed illustration of an alignment process in accordance with the principles of the present invention. In this illustrative example the alignment pattern is 1234. This alignment pattern is sent to a pattern recipient. The alignment pattern recipient is responsive to the receipt of the alignment pattern by producing a pattern output. The alignment pattern may pass through the pattern recipient unmodified, as in this illustration, or it may be modified in a predictable way. The output is windowed and may or may not be aligned with the alignment pattern that was received. The windowing process may be the result of a communications device converting a serial bit stream into a series of parallel words, for example. In this example, the received alignment pattern is windowed in four-number windows as illustrated by windows W1 through W5. The aligner compares the windowed numbers to the expected, 1234, pattern. In window W1 the aligner notes that the windowed 3412 pattern does not match the expected 1234 pattern and shifts the alignment pattern by inserting a "1" into the pattern, as indicated by SHIFT1. In the comparison of windowed pattern W2, the aligner notes that the windowed pattern 3411 does not match the expected pattern. Because a shift has just been executed though, the aligner does not immediately execute another shift. That is, at least one window period is set aside for the comparison of the shift results (e.g., window W3), as opposed to the shift window (e.g., window W2) with the alignment pattern.

In window W3 the aligner compares the 2341 pattern to the expected 1234 pattern and determines there is not a match. Consequently, the aligner shifts the alignment pattern once again by inserting a "1", as indicated by SHIFT2 in the Figure. In the comparison of the windowed pattern W4, the aligner once again notes that, although the 2341 pattern does not match the 1234 expected pattern, it has just executed a shift and will therefore not execute a shift during the next window period. In the examination of the windowed pattern W5, the aligner recognizes that the windowed pattern W5 matches the expected pattern and that, consequently, the alignment pattern recipient is aligned with the aligner. The aligner may then commence to send aligned data to the alignment pattern recipient. In an illustrative embodiment, a tester sends the alignment pattern to a device under test and the tester monitors the device under test to detect the alignment pattern.

Figure 3:
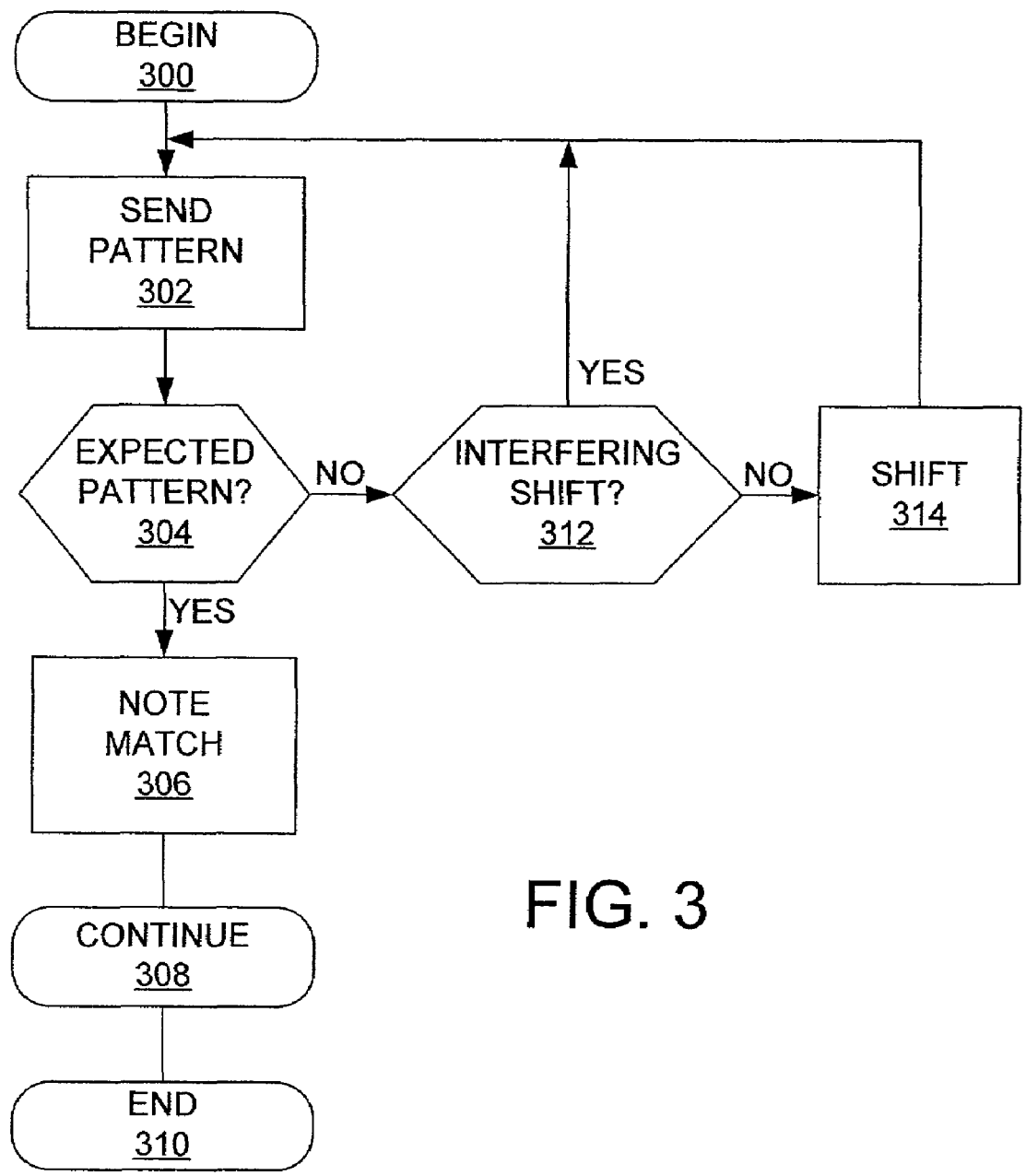
FIG. 3 is a flow chart of a pattern alignment process in accordance with the principles of the present invention.

The flow chart of FIG. 3 illustrates a data alignment process in accordance with the principles of the present invention. The process begins in step 300 and proceeds from there to step 302 where an aligner sends an alignment pattern to an alignment pattern recipient. The recipient may respond to the receipt of data by reproducing the data or by modifying the data in a predictable manner. From step 302 the process proceeds to step 304 where the aligner compares a windowed pattern to the expected pattern. If the windowed pattern matches the expected pattern, the process proceeds to step 306 where the aligner notes the match. This step may include the setting of a flag or other operation that provides at least an internal indication that a match has been found. From step 306 the process proceeds to step 308 where the aligner continues processing. The continued processing may include a smooth transition from the alignment pattern to a data pattern while maintaining the alignment that has been achieved in previous steps. After such a transition the aligner may be called upon to align more data patterns, in the "continue" step 308, or it may proceed to end the alignment process in step 310.

If, in step 304 the aligner determines that there is not a match between the windowed pattern and the expected pattern, the process proceeds to step 312 where the aligner determines whether there has been a shift recently enough to interfere with the comparison process. For example, if the pattern shift is accomplished by inserting a number into the alignment pattern, the aligner will skip over the window that includes the extra number and will only shift again for a subsequent window. A shift that involves the deletion of a number from the alignment pattern does not require the aligner to skip a windowed pattern. If, in step 312, the aligner determines that a potentially interfering shift has occurred (assuming the shift is effected through the insertion of an additional number), the process returns to step 302 and from there as previously described. On the other hand, if no potentially interfering shift has occurred, the process proceeds from step 312 to step 314 where the pattern is shifted, for example, by inserting an extra number in the pattern string. From step 314 the process proceeds to step 302 and from there as previously described.

Figure 4:
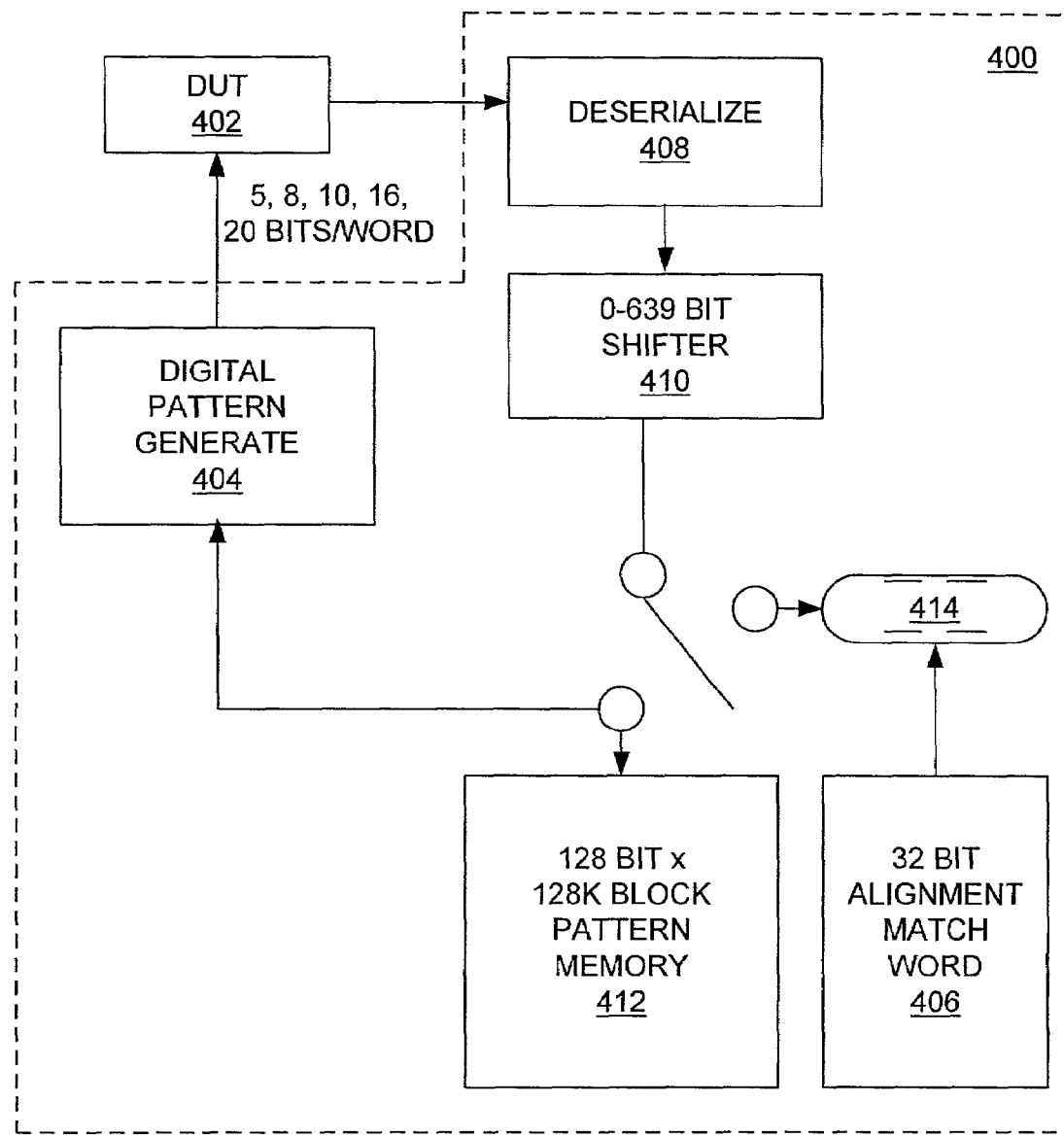
FIG. 4 is a block diagram of tester in accordance with the principles of the present invention configured to test the transmit portion of a high speed serial communications device.

The conceptual block diagram of FIG. 4 depicts a digital tester 400 that employs an aligner in accordance with the principles of the present invention. The tester 400 tests a device under test (DUT) 402. In this illustrative embodiment the tester 400 may be employed to test a DUT 402 that is a synchronous serial communications device that, on its transmit side, accepts parallel data and converts the parallel data to serial form for transmission. In this illustrative example the DUT 402 may accept data in a variety of widths, including, 5, 8, 10, 16 or 20-bit words.

The tester 400 generates a test pattern, loads the test pattern in the DUT 402, and monitors the output of the communications device for a test pattern. In this illustrative embodiment, a pattern generator 404 produces a digital test pattern that is sent to the DUT 402. The pattern may be a pattern stored in memory or a pattern generated in a pseudo-random generator, for example. In addition to the test pattern, the pattern generator 404 generates an alignment pattern that it repeatedly loads into the DUT 402 until it receives an indication from the alignment word match comparator 414 that alignment has been achieved, whereupon the pattern generator 404 commences to load the test pattern into the DUT 402. In order to be effective, the test pattern will typically be many bytes long. In order to permit the derivation of a clock signal from data transmitted by a synchronous communications device, such devices operate continuously. Consequently, the expected test pattern will arrive at a monitoring portion of the tester (e.g., including deserializer 408, shifter 410, test pattern memory 412, comparator 414 and storage for the alignment pattern 406) in a continuous stream of data. In an illustrative embodiment, the DUT 402 is a high-speed device that transmits serial data at a very high rate.

In order operate the comparison process at a slower clock rate, the serial data stream from the DUT 402 is converted to parallel form. The deserializer converts the serial data from the DUT 402 to a block of data of a dimension that accommodates any word width involved. For example, in order to accommodate any of the word widths in which the DUT 402 might send data (e.g., 5, 8, 10, 16, or 20 bit) and, at the same time, accommodate the pattern memory storage width of 128 bits, the deserializer 408 deserializes data into blocks of 640 bits, the least common multiple, and loads the blocks into the shifter 410. The comparator 414 need not examine the entire 640-bit block to detect alignment. In this illustrative example, the comparator searches for a match with a thirty-two-bit alignment match word within the 640-bit block to detect alignment. The thirty-two-bit match word is unique within the 640-bit block. In this illustrative embodiment, the thirty-two-bit match word is positioned at the head of the block. The comparator 414 examines thirty-two bit words within each alignment block in search of a match with the thirty-two-bit alignment match word stored in the storage 406. If no match is detected, the shifter 410 shifts subsequent alignment blocks until a match between the first thirty-two bits of an alignment block and the alignment match word is detected. Once a match is detected, the pattern generator 404 is alerted to that fact and it may then proceed to transmit a test pattern. The shifter 410 quits shifting.

After alignment is achieved it must be maintained. This could be accomplished by providing an indication of how many bits of alignment data remain after the alignment match word is detected, for example. In this illustrative embodiment, the alignment word is at the beginning of the 640-bit block. The first block of data not to contain the alignment word in its first thirty-two bits after the comparator 414 indicates that a match has been found is recognized by the comparator as the first block of the test pattern and the comparator directs the 128K 128-bit words of the test pattern into pattern memory storage 412.

Figure 5:
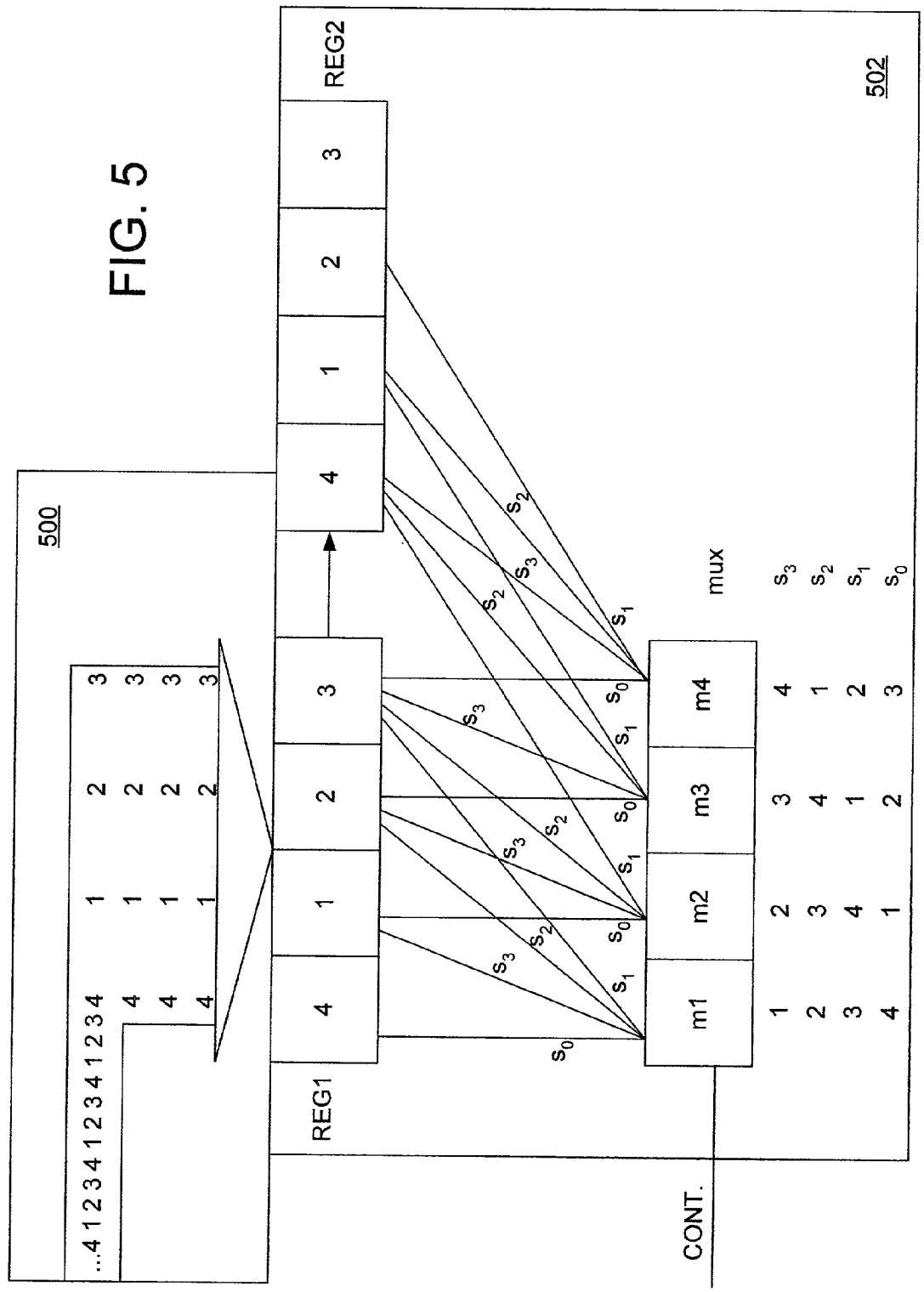
FIG. 5 is a block diagram of a shifter in accordance with the principles of the present invention.

The block diagram of FIG. 5 illustrates conceptually the operation of a data shifter in accordance with the principles of the present invention. Such a data shifter may be employed in a variety of applications, including in a tester such as the tester 400 of FIG. 4. In this illustrative embodiment, a serial-to-parallel converter 500 converts a serial data stream consisting of a repeated pattern 1234. Such a pattern may be used as an alignment pattern, for example. In this illustrative embodiment, the serial-to-parallel converter 500 converts the data stream to four-bit words. As indicated by the vertically repeated 4123 pattern, the serial-to-parallel converter continuously makes the conversion and makes the four-bit words available at an output. Additionally, in this illustrative embodiment, the serial-to-parallel converter is not aligned with the 1234 pattern and converts the data stream into a series of 4123 words. Serial-to-parallel conversion may be employed, for example in testing a high-speed serial communications device. By converting the serial data stream to parallel form, the clock speed at which such operations as checking for a match between a match word and the input data stream may be substantially reduced.

Four-bit blocks of data produced by the parallel-to-serial converter 500 are sent to the shifter 502. The shifter includes two four-bit registers, REG1 and REG2 and a multiplexor, MUX. Data received from the serial-to-parallel converter 500 is loaded into the register, REG1. When the next four-bit word is received from the serial-to-parallel converter 500, the contents of register REG1 are loaded into register REG2 and the latest four-bit word from the serial-to-parallel converter is loaded into register REG1. Conceptually, the multiplexor MUX is a four-of-sixteen multiplexor in this illustrative embodiment. That is, each of the multiplexor segments M1, M2, M3, and M4 may select data from one out of four of the register segments. The leftmost segment M1 may select data from the leftmost segment of REG1, from the second-from-the-left segment of REG1, from the third-from-the-left segment of REG1, or from the fourth-from-the-left segment of REG1. The second-from-the-left segment of the multiplexor M2 may select from the second-from-the-left segment of REG1, from the third-from-the-left segment of REG1, from the fourth-from-the-left segment of REG1, or the leftmost segment of REG2. The third-from-the-left segment of the multiplexor M3 may select from the third-from-the-left segment of REG1, from the fourth-from-the-left segment of REG1, the leftmost segment of REG2, or the second-from-the-left segment of REG2. The fourth-from-the-left segment of the multiplexor M4 may select from the fourth-from-the-left segment of REG1, the leftmost segment of REG2, the second-from-the-left segment of REG2, or the third-from-the-left segment of REG2. Other arrangements are possible and contemplated within the scope of this disclosure. A zero-shift result 4123, labeled S0, corresponds to each multiplexor segment selecting from its "zero" position, as indicated by the lines labeled S0. With a signal from the control input CONT the multiplexor may be set to select from a different group of register segments. The 3412 pattern labeled S1, corresponds to the multiplexor selecting from the register segments as indicated by the labels S1. This shift amounts to a barrel shift. Similar shifts may be effected as indicated by the 2341 S2 and 1234 S3 patterns. If each of the patterns is tested for a match with the 1234 pattern, the S3 shift would yield a match.

Figure 6:
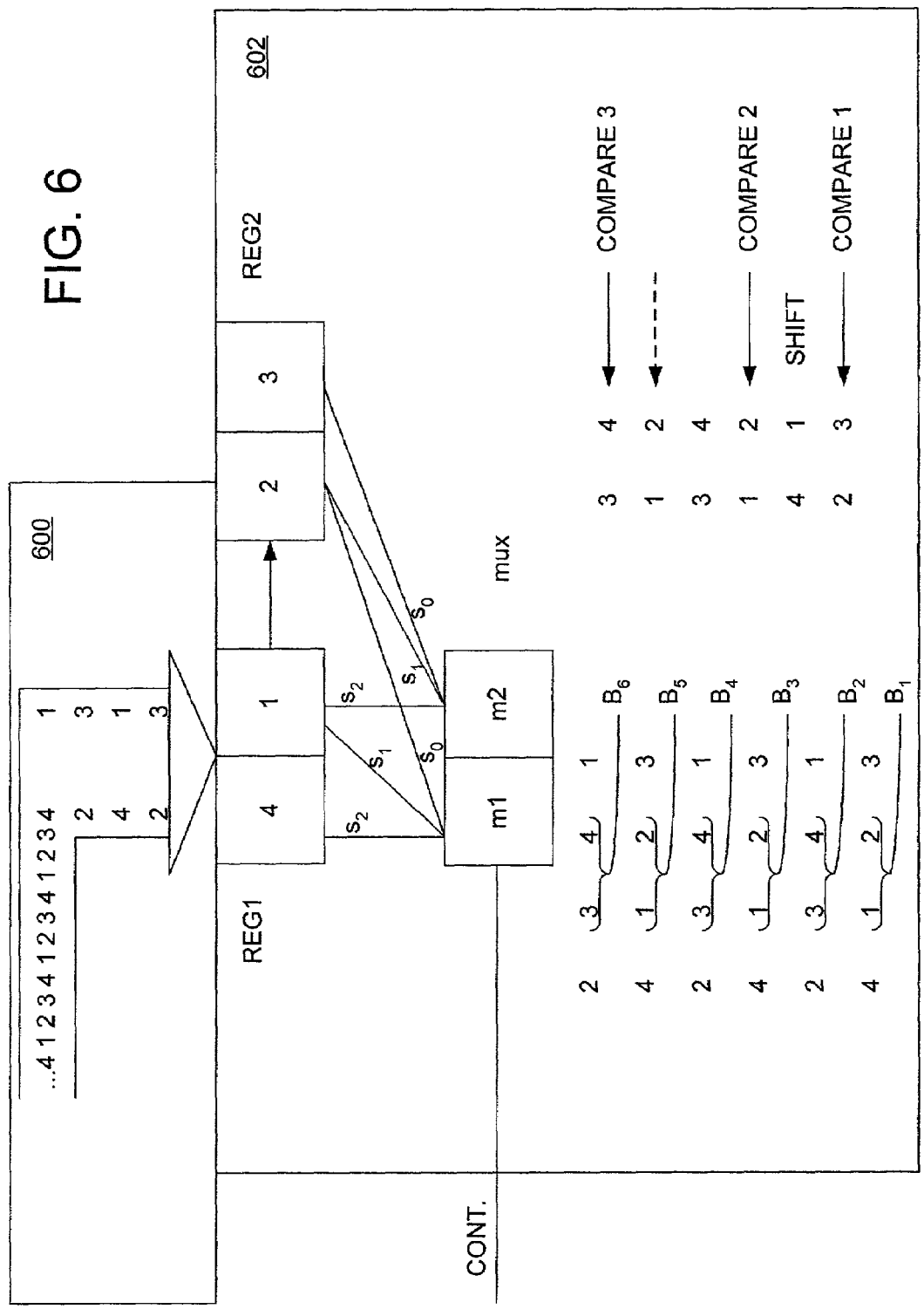
FIG. 6 is a block diagram of a multi-stage shifter in accordance with the principles of the present invention.

Scaled up to the scale of the tester described in the discussion related to FIG. 4, each of the registers REG1 and REG2 would be a 640-bit register and the multiplexor MUX would be a 640 segment multiplexor. In an integrated circuit embodiment, the area occupied by the shifter may be reduced by implementing a multi-stage shifter such as the multi-stage shifter depicted conceptually in the block diagram of FIG. 6. In this illustrative embodiment a serial-to-parallel converter 600 receives a repetitive 1234 data stream, as in the example of FIG. 5. However, in this example, the serial-to-parallel converter converts the serial data stream into two-bit words, rather than the four-bit words of FIG. 5. Lines labeled S0, S1 and S2 between the multiplexor and registers REG1 and REG2 respectively indicate zero-shift and one-shift selections.

The vertical column of two-bit entries represents a sequence of multiplexor outputs. To the left of the multiplexor outputs are the corresponding values within REG1 and REG2. The multiplexor selection process is indicated by the brackets labeled B1, B2, B3, B4, B5, and B6. For example, bracket B1 indicates that the S0 multiplexor position is selected with the resultant 23 selected at the output, bracket B2 again indicates an S0 multiplexor position, with the resultant 41 selected. After the selection corresponding to bracket B2, the multiplexor is modified to the S1 position, with the bracket B3 indicating the selection of a 12 resultant. Subsequent multiplexor selections and their corresponding resultants are B4—34, B5—12, and B6—34. If every other one of the two-bit words is compared to an expected value, for example the leading 12 of a 1234 sequence, the multiplexor-based shifting will shift the desired 12 pattern into place for comparison. Further shifting may be accomplished by altering the timing of the comparison time slots (COMPARE1, COMPARE2, COMPARE3). One way in which this comparison-time-slot-shift may be effected, is indicated by the comparison time slot COMPARE3, which has been moved to skip a compare that would otherwise have taken place. That is, skipping a comparison cycle (or adding one) is equivalent to a full-word-shift. In the 640-bit block tester embodiment described in relation to the discussion of FIG. 4, a multi-level shifter such as this may be implemented by comparing every fifth one hundred and twenty-eight-bit word. To shift within a one hundred and twenty eight-bit word, two one hundred and twenty eight bit registers and a one hundred twenty eight-segment multiplexor may be used. Full word shifts may be accomplished by skipping or adding a comparison with one of the words.

To test the receive side of a communications device, the tester transmits a serial test pattern to the serial communications device under test. As in the transmit side test, the test pattern must be aligned with the pattern expected at the monitor side of the tester. In an illustrative embodiment an aligner loads an alignment pattern into a serializer which serializes the alignment pattern. The serialized alignment pattern is transmitted to the communications device being tested. The communications device under test converts the alignment pattern to parallel and the tester attempts to match the pattern on its monitoring side. If no match is detected, the monitoring side of the tester indicates there is no match and the tester's transmission side shifts the alignment pattern. In operation, "no match" may be a default condition that is overridden by the monitoring side of the tester setting a flag whenever the monitoring side detects a match. The tester repeats the shifting/matching process until a match is detected. Once a match is detected, that is, once the alignment pattern is detected on the monitoring side, the pattern generating side is alerted to the fact that alignment has been achieved. The pattern generator side of the tester then proceeds to transmit the actual test pattern, keeping the pattern in alignment with the pattern expected by the monitoring side of the tester.

Figure 7:
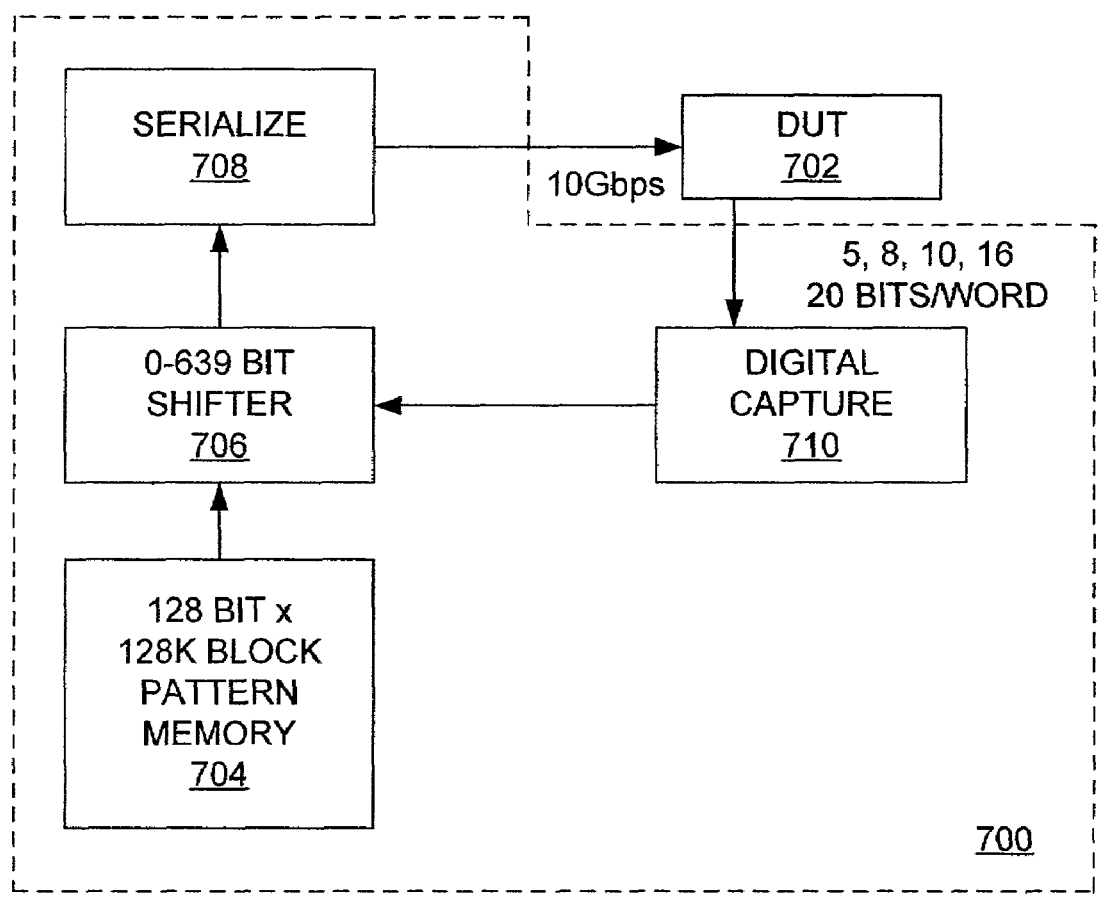
FIG. 7 is a block diagram of a tester in accordance with the principles of the present invention configured to test the receive portion of a high-speed serial communications device.

The conceptual block diagram of FIG. 7 depicts a digital tester 700 that employs an aligner in accordance with the principles of the present invention. The tester 700 tests a device under test (DUT) 702. In this illustrative embodiment the tester 700 may be employed to test a DUT 702 that is a synchronous serial communications device that, on its receive side, accepts serial data and converts the serial data to parallel form for transmission. In this illustrative example the DUT 702 may produce parallel data in a variety of widths, including, 5, 8, 10, 16 or 20-bit words.

Before the tester 700 sends the test pattern to the DUT 702, the shifter 706 loads the DUT 702 with an alignment pattern that the tester 700 attempts to match on the tester's monitoring side (e.g., digital capture block 710). If no match is detected, the monitoring side of the tester alerts the shifter that no match has been found. This may be implemented by default. That is, for example, a flag may be reset at the beginning of a test and remain reset until the digital capture block 710 encounters a match, at which time the digital capture block 710 sets the flag, thereby alerting the shifter. With no match, the shifter 706 shifts the alignment pattern and repeats the shifting/matching process until a match is detected. The pattern generator side of the tester then proceeds to transmit the actual test pattern, keeping the pattern in alignment with the pattern expected by the monitoring side of the tester. The tester 700 generates a test pattern, stored as 128K 128-bit words in pattern memory 704. The pattern memory also stores a 640-bit block of alignment pattern.

In an operation similar to that of testing the transmit side of the DUT, the alignment pattern is repeatedly loaded into a shifter 706, converted from parallel to serial form in the serializer 708 and sent to the DUT 702. The digital capture block 710 compares the parallel data from the DUT to an expected alignment pattern. The shifter 706 shifts the alignment pattern until the digital capture block 710 finds a match between data received from the DUT 702 and the expected alignment pattern and is alerted to that fact by the digital capture block 710. At the time the digital capture block finds a match, the digital capture block 710 is aligned with data from the sending side (e.g., serializer 708, shifter 706, and pattern memory 704) and the sending side may send the 128-bit by 128K block of pattern memory to fully exercise the DUT 702.

As in the case of testing the transmit side of such as serial communications device, in order to be effective, the test pattern will typically be many bytes long. In order to permit the derivation of a clock signal from data transmitted by a synchronous communications device, such devices operate continuously. Consequently, the expected test pattern will arrive at a monitoring portion of the tester (e.g., digital capture block 710) in a continuous stream of data words. In an illustrative embodiment, the DUT 702 is a high-speed device that receives serial data at a very high rate and converts the data to 5, 8, 10, 16, or 20 bit words. In order to operate the comparison process at a slower clock rate, the parallel data stream from the DUT 402 may be converted to broader parallel form. The comparison/shifting process may be implemented in a manner akin to that described in the discussion related to FIGS. 4,5, and 6, except that, in this illustrative embodiment, the shifting takes place before the alignment pattern is serialized for transmission to the DUT 702.

Although various exemplary embodiments of the invention have been disclosed, it will be apparent to those skilled in the art that various changes and modifications can be made which will achieve some of the advantages of the invention without departing from the spirit and scope of the invention. It will be apparent to those reasonably skilled in the art that other components performing the same functions may be suitably substituted. The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. A data shifter comprising:
    a first data register configured to accept parallel data;
    a second data register configured to accept parallel data from the first data register; and
    a multiplexor including one or more control inputs, said multiplexor configured to select data from among one or more locations within the first and second data registers as indicated by said one or more control inputs, wherein the multiplexor includes a plurality of output segments, each one of which is configured to select data from a plurality of locations within one or both of the registers.

2. The data shifter of claim 1 wherein the registers are equal-length registers configured to sequentially hold identical data.

3. The data shifter of claim 1 wherein the multiplexor is configured to window data held within the registers.

4. The data shifter of claim 3 wherein the multiplexor control is configured to select data for each multiplexor element from corresponding register elements, thereby providing a sliding selection window for the registers.

5. The data shifter of claim 4 wherein the output of the multiplexor forms the output of the data shifter.

6. The data shifter of claim 4 further comprising a sampler configured to periodically sample the output words of the multiplexor and to output the results of the periodic sampling as the output of the data shifter.

7. The data shifter of claim 6 wherein the sampler is configured to alter its sampling period and to thereby shift the output of the shifter in multiplexor word-length increments.

8. The data shifter of claim 7 wherein the data shifter is configured to shift binary data.

9. The data shifter of claim 7 wherein the data shifter is configured to shift multi-bit blocks of data.

10. A method for shifting data comprising the steps of:
    a first data register receiving parallel data;
    a second data register receiving parallel data from the first data register; and
    a multiplexor including one or more control inputs, said multiplexor selecting data from among one or more locations within the first and second data registers as indicated by said one or more control inputs, wherein the multiplexor includes a plurality of output segments, each one of which selects data from a plurality of locations within one or both of the registers.

11. The method of claim 10 wherein the registers are equal-length registers that sequentially hold identical data.

12. The method of claim 10 wherein the multiplexor windows data held within the registers.

13. The method of claim 12 wherein the multiplexor control selects data for each multiplexor element from corresponding register elements, thereby providing a sliding selection window for the registers.

14. The method of claim 13 wherein the multiplexor produces the output of the data shifter.

15. The method of claim 13 further comprising the step of a sampler periodically sampling the output words of the multiplexor and outputting the results of the periodic sampling as the output of the data shifter.

16. The method of claim 15 wherein the sampler alters its sampling period and thereby shifts the output of the shifter in multiplexor word-length increments.

17. The method of claim 16 wherein the sampler skips a single sampling period and thereby shifts the output of the shifter by one multiplexor word-length.

* * * * *